United States Patent
Hamberger et al.

(10) Patent No.: US 11,002,778 B2
(45) Date of Patent: May 11, 2021

(54) DETERMINING THE PHASE CENTER OF AN ANTENNA

(71) Applicant: Rohde & Schwarz GmbH & Co. KG, Munich (DE)

(72) Inventors: Gerhard Hamberger, Griesstaett (DE); Hendrik Bartko, Unterhaching (DE); Mert Celik, Munich (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 0 days.

(21) Appl. No.: 16/577,739

(22) Filed: Sep. 20, 2019

(65) Prior Publication Data

US 2021/0088570 A1    Mar. 25, 2021

(51) Int. Cl.
    *G01R 29/10*    (2006.01)

(52) U.S. Cl.
    CPC .................... *G01R 29/10* (2013.01)

(58) Field of Classification Search
    None
    See application file for complete search history.

(56) References Cited

U.S. PATENT DOCUMENTS

| | | | | |
|---|---|---|---|---|
| 2,663,014 | A * | 12/1953 | Godeck | G01S 7/12 342/133 |
| 4,407,001 | A * | 9/1983 | Schmidt | H01Q 19/132 342/360 |
| 8,952,848 | B2 * | 2/2015 | Benavides | H01Q 3/267 342/442 |
| 10,830,805 | B2 * | 11/2020 | Derat | G01R 29/105 |

(Continued)

FOREIGN PATENT DOCUMENTS

| | | | | |
|---|---|---|---|---|
| CN | 107589540 | * | 1/2018 | ............. G02B 26/06 |
| CN | 107657098 | * | 2/2018 | ............. G06N 3/006 |
| CN | 107944133 | * | 4/2018 | ............. G06N 3/006 |
| CN | 109490880 | * | 3/2019 | ......... G01S 13/9023 |

(Continued)

OTHER PUBLICATIONS

Pieter N. Betjes, An Algorithm for Automated Phase Center Determination and its Implementation, printed Jan. 8, 2021 (Year: 2021).*

(Continued)

*Primary Examiner* — Tung S Lau

(74) *Attorney, Agent, or Firm* — Ditthavong, Steiner & Mlotkowski

(57) ABSTRACT

A computer-implemented method for determining the phase center of an antenna under test comprises the following steps: acquiring a transmitted near-field or far-field signal of the antenna under test, by rotational movement of a measuring antenna relative to the antenna under test, the rotation covering at least the angle between the z axis and the x axis of the antenna, the rotational movement covering a spherical measurement region, the acquisition being performed at different angles phi to the z axis and while rotating, relative to the measuring antenna, the antenna under test around its z axis, obtaining far-field phase data by applying a field transformation on the near-filed or far-filed signal obtained, determining the main beam peak location within the measurement region, and transforming the coordinate center of the far-field data based on the main beam peak location in order to determine the phase center.

15 Claims, 3 Drawing Sheets

(56) References Cited

U.S. PATENT DOCUMENTS

Figure 1:
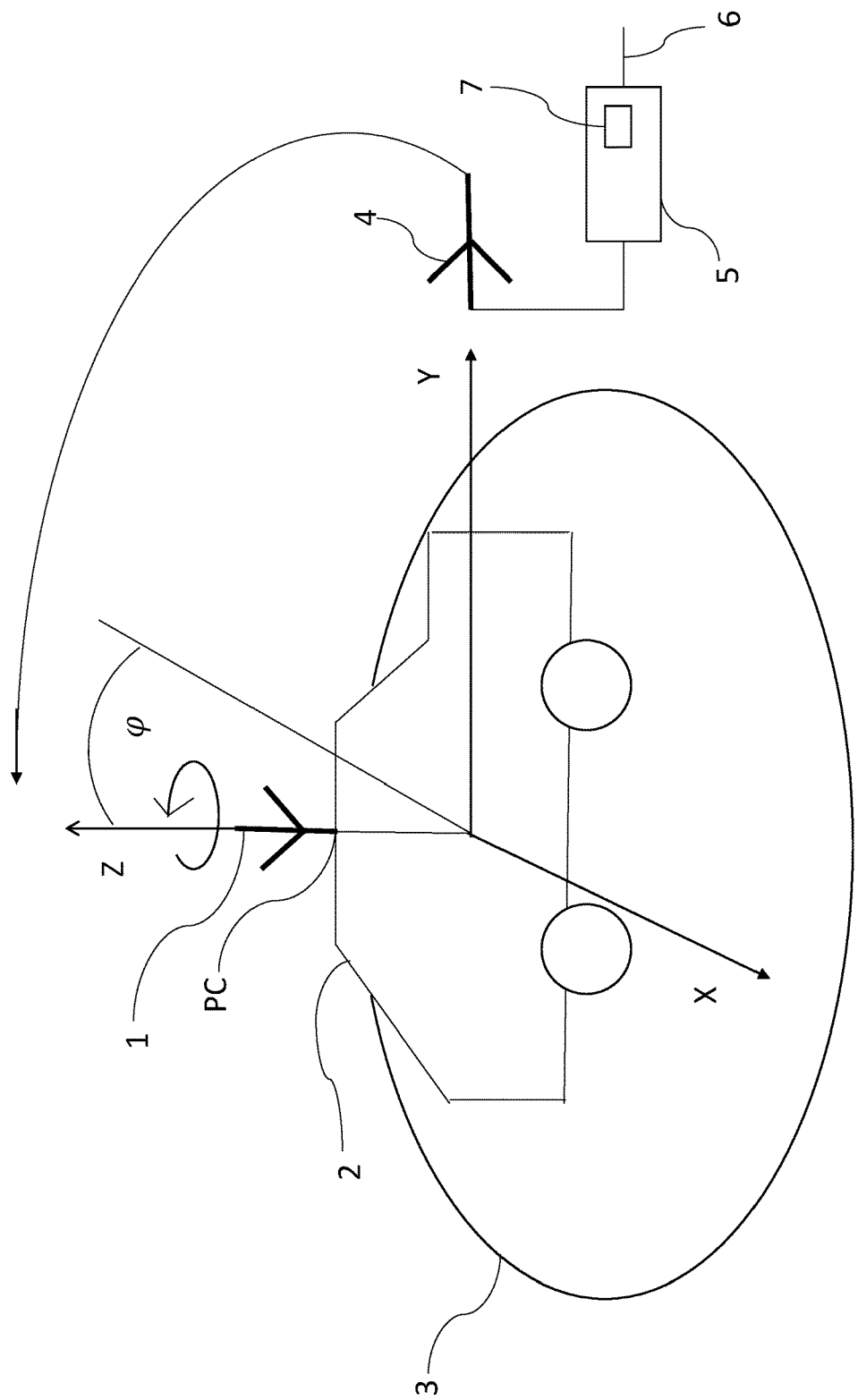

2008/0218400 A1\* 9/2008 Stolarczyk .............. E21C 35/24
 342/22
2018/0375594 A1\* 12/2018 Kildal .................... H01Q 15/14

FOREIGN PATENT DOCUMENTS

| EP | 3182619 | \* | 6/2017 | ............. H01Q 15/14 |
| WO | WO 2017091845 | \* | 6/2018 | ........... H01Q 3/2682 |

OTHER PUBLICATIONS

Betjes, "An algorithm for automated phase center determination and its implementation", published in Proc. Antenna Meas. Technol. Assoc. Annu. Symp., Nov. 2007, pp. 1-6, 6 pages.

\* cited by examiner

DETERMINING THE PHASE CENTER OF AN ANTENNA

The present invention relates to the determination of the phase center of an antenna.

The phase center is the point from which the electromagnetic radiation spreads spherically outward, with the phase of the signal being equal at any point on the sphere. Thus, the phase in the far field does not change when the antenna is rotated around this phase center point.

Typically manufacturers of antennas, user equipment or vehicles comprising an antenna are interested in the actual phase center of receivers (such as for example GPS receiver) or transmitter.

The information as to the actual phase center is typically calculation by evaluating the curvature of the far-field phase information of the transmitting antenna. To this regard typically a probe is rotated in predefined phi angles relative to the z axis of the antenna under test. In each of these angular positions data are obtained, which are often called "phi cuts" as typically at the antenna under test is rotated around its z axis. In many cases, it is difficult to detect and choose the correct predefined angular position in order to get reliable information (phi cuts) about the phase center.

U.S. Pat. No. 8,952,848B2 discloses a system and method for determining the location of the phase center of an antenna.

P. N. Betjes, "An algorithm for automated phase center determination and its implementation", Proc. Antenna Meas. Technol. Assoc. Annu. Symp., pp. 1-6, November 2007 teaches an algorithm to determine the position of the phase center from an amplitude/phase measurement of an antenna.

Therefore, there is a need for providing an approach in which no predefined patent cuts are required in order to obtain the phase center location information.

This object is achieved by means of the features of the independent claims. The dependent claims develop further the central idea of the invention.

According to the invention, no information or pre-knowledge as to the radiation pattern of the antenna under test is required. Finding the angular range for evaluation the phase center of an antenna under test, according to the invention may be automated.

As an advantage, the approach according to the invention may not only be used to determine the phase center of a car or an airplane antenna on a rotating disc, but also of a smaller device under test (DUT), such for example a laptop computer or a mobile phone.

The computer-implemented approach according to the invention may find the may-beam-peak itself, as well as preferably also the appropriate beam region for evaluating the phase center.

Furthermore, the polarization angle of linearly-polarized antennas is found by the method according to invention, in order to evaluate the method on the co-polarized component.

An aspect relates to a computer-implemented method for determining the phase center of an antenna under test, the method comprising the following steps:

acquiring near-field or far-field data of the antenna under test, by rotational movement of a measuring antenna relative to the antenna under test, the rotation covering at least the angle between the z axis and the x axis of the antenna, the rotational movement covering a spherical measurement region, the data acquisition being performed at different angles phi to the z axis and while rotating, relative to the measuring antenna, the antenna under test around its z axis, a.) obtaining far-field phase data by applying a field transformation on the near-filed or far-filed data acquired, b.) determining the main beam peak location within the measurement region, and c.) transforming the coordinate center of the far-field data based on the main beam peak location in order to determine the phase center.

The transforming step may comprise the steps of:

d.) applying a coordinate transformation rotation matrix to the coordinate system of the main peak location, e.) determining the polarization angle Chi of the antenna under test, f.) rotating the far-field data by subtracting the polarization angle Chi, g.) applying a polarization transformation to obtain co- and cross-polarized components for all acquisitions at different Phi angles, h.) evaluating the phase centers for all phi angles on the basis of the co-polarized components, i.) determining the common phase center using the phase centers for all phi angles.

The method may comprise—after step i.)—the further step of j.) applying an inverse rotation matrix to the matrix of step d.) in order to obtain the phase center in the original coordinate system.

A near field to far field transformation may be applied in case of an obtained near field signal, and a far field to far field transformation in case of an obtained far field signal.

The near field to far field transformation may be a fast irregular field transformation FIAFTA.

The polarization of the antenna under test may be any of linear, slanted linear and/or circularly polarized.

Only one linear polarization may be used in in step e.) in case of circular polarization. The transformation of step g.) may be a Ludwig III transformation.

The measurement region may present the shape of any spherical cap including a truncated spherical cap.

Especially the measurement region may have the shape of a hemisphere.

The antenna under test may be a vehicle antenna, such as e.g., a car antenna or an airplane antenna, or a mobile terminal antenna, mounted on a rotatable support.

An aspect relates to a computer-based measurement device method for calculating the phase center of an antenna under test, programmed to perform a method as exemplified above, and for outputting a phase center indication signal.

A further aspect relates to a program of instructions storable on a computer readable medium for causing a computer to execute steps of the methods explained above.

Figure 2:
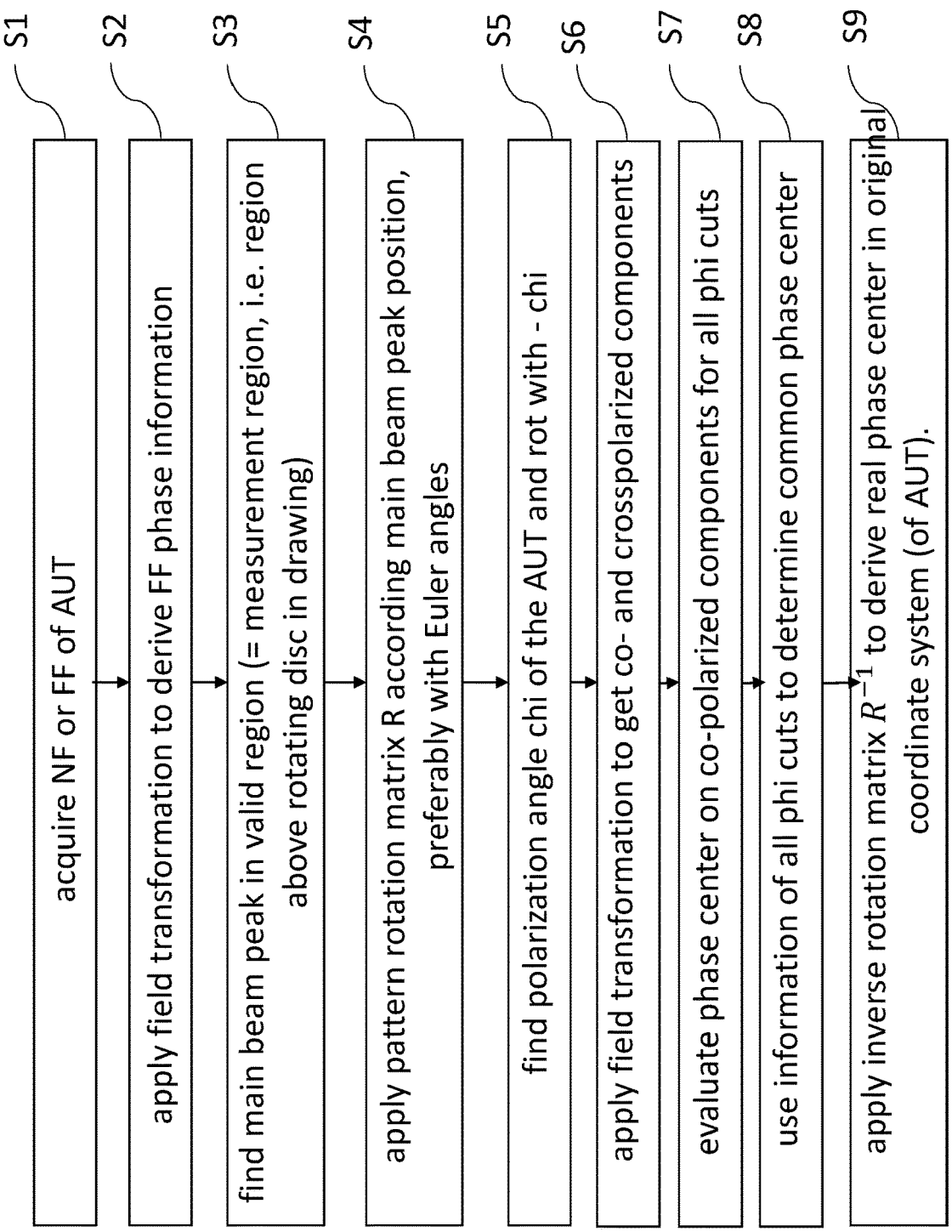
Figure 3:
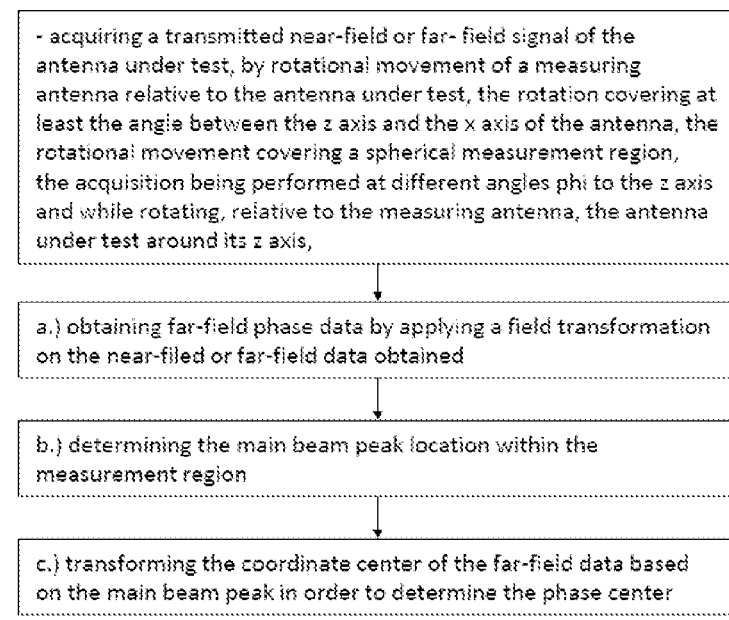

Further aspects, advantages and features of the invention will become evident when going through the following detailed description of embodiments, taking conjunction with the figures of the enclosed drawings:

FIG. 1 shows, in a schematic view, an experimental set up for carrying out the method according to the invention, FIG. 2 shows a block diagram, explaining an approach according to the invention, and FIG. 3 shows a block diagram, explaining a fundamental approach according to the invention.

As can be seen in FIG. 1, an antenna under test 1, which in the present example is an antenna 1 of a mobile vehicle 2, such as for example a car, can be made to rotate around the Z-axis of the antenna 1. This can be done e.g. by placing the car to another to which antenna 1 is mounted, on a rotating disc 3, which disc 3 may rotate around the X-set of the antenna. A receiving antenna (probe) 4) is provided, which may be rotated in an angle phi between the X-axis and of the antenna and the Z-axis of the antenna 1. Thus, the combination of the rotation of the antenna 1 around the Z-axis together with the rotational movement of the probe 4 leads to a measurement region, which may be a full hemisphere or a truncated portion of a hemisphere. During the rotation of the probe near filed or far field data are acquired at different angular phi positions, which data are called "phi cuts" as at the same time the antenna under test is rotated around the z axis of the antenna.

Further aspects will now be explained with reference to FIG. 2:

In a step S1 the probe 4 acquires near field (NF) or far field (FF) data of the antenna under test (AUT).

In a step S2 a field transformation is applied on the acquired NF or FF data to derive FF phase information. In case of a NF measurement, a NF2FF field transformation may be used. Such NF2FF transformation is generally known, see e.g.

https://www.eecs.wsu.edu/~schneidj/ufdtd/chap14.pdf

In case of a FF measurement by the probe 4 a FF2FF field transformation may be applied.

In a step S3 the main beam peak is obtained in the measurement region, which for example of FIG. 1 is the region above the rotating disc 2.

In a step S4, a patent rotation matrix R is applied on the acquired NF or FF data, to transform the obtained data in a coordinate system according to the main beam peak position. Preferably, the resulting coordinate system is expressed in Euler angles, i.e. the three Euler angles with regard to the main beam. Thus, the phase center determination is taking place in the coordinates system of the main beam orientation. In a following step, see further below, the phases may then be transformed in the xyz coordinate system of the antenna ("real world coordinates").

In a step S5 the polarization angle Chi of the AUT is calculated. Further, the NF or FF data in the main beam peak coordinate system are then rotated by subtracting the calculated polarization angle Chi.

In a step S6 a field transformation is applied in order to obtain co- and cross-polarized components of the transformed and rotated NF or FF data. The field transformation may be LL3 (Ludwig 3) transformation, see A. C. Ludwig, "The Definition of Cross-Polarization", IEEE Trans. Antennas Propagation, vol. AP-21 no. 1, pp. 116-119, January 1973.

In a step S7 the phase center of the co-polarized components is evaluated for all Phi cuts, i.e. for all angular positions Phi at which, during the rotation of the probe 4, NF or FF data have been obtained in step S1.

The information of all Phi cuts is then used in order to determine the common phase center. The common phase in step S8 is expressed in the coordinate system of step 4, i.e. in the coordinate system of the main beam peak.

In a step S9 an inverse rotation matrix to the matrix applied in S4 is used to derive the "real" phase center in the original coordinate system of the antenna under test.

The phase center position information may then be displayed (on an external or integrated display 7 of the device or output via a wireless or wire-bound interface of a computer-based device 5 processing the data obtained by the probe 4 (e.g. by implementing the method of FIG. 2).

The polarization of AUT may be any of linear, slanted linear or circularly polarized.

The method may be applied to truncated data which means Phi cuts located in any arbitrary circular cap may be used, wherein the spherical cap does not have to be a perfect hemisphere.

As shown in FIG. 1, the method claim be applied to determine the phase center of an antenna for example of a vehicle (such as for example a car) and a test bench (comprising the rotating disc 3).

As can be seen in FIG. 3, a fundamental approach according to the invention comprises the steps of independent claim 1.

The method according to the invention is also applicable to circularly, polarized antennas, but just one linear polarization may then be used for the phase center calculation. This approach is valid with a slightly reduced dynamic range, which normally does still give sufficient results as to the phase center calculation.

Additional optional input information can be used in the method such as for example an information regarding the angular region, i.e. the Phi angles covered by the Phi cuts, utilized for the phase center calculation.

As explained, the method is applicable to both near-field (NF) and far-field (FF) measurement data. If near-field data is applied a fast irregular field transformation algorithm (FIAFTA) may be utilized to calculating the corresponding far-field data. FIAFTA is known as such. This may be done by calculating equivalent electric or magnetic currents on an applied Huygens surface which needs to be large enough to cover all possible phase center positions. The phase information is preserved during the NF-FF transformation and is possible to directly apply the phase center calculation method according to the invention to the calculated FF data (comparable to FF data obtained by prop measurement.

Thanks to the applicability of the FIAFTA to truncated data, it is also possible to apply the method even if only one hemisphere is measured.

The invention claimed is:

1. A computer-implemented method for determining the phase center of an antenna under test, comprising the following steps:
   acquiring a transmitted near-field or far-field signal of the antenna under test, by rotational movement of a measuring antenna relative to the antenna under test, the rotation covering at least the angle between the z axis and the x axis of the antenna, the rotational movement covering a spherical measurement region,
   the acquisition being performed at different angles phi to the z axis and while rotating, relative to the measuring antenna, the antenna under test around its z axis,
   a.) obtaining far-field phase data by applying a field transformation on the near-field or far-field data obtained,
   b.) determining the main beam peak location within the measurement region, and
   c.) transforming the coordinate center of the far-field data based on the main beam peak in order to determine the phase center.

2. The method of claim 1,
   wherein the phase center is determined in the coordinate system of the main beam.

3. The method of claim 1,
   wherein the phase center is calculated on the basis of co-polarized components of the near-field or far-field data.

4. The method of claim 1, wherein step c.) comprises the steps of:
- d.) applying a coordinate transformation rotation matrix to the coordinate system of the main peak location,
- e.) determining the polarization angle Chi of the antenna under test,
- f.) rotating the far-field data by subtracting the polarization angle Chi,
- g.) applying a polarization transformation to obtain co- and cross-polarized components for all acquisitions at different Phi angles,
- h.) evaluating the phase centers for all phi angles on the basis of the co-polarized components, and
- i.) determining the common phase center using the phase centers for all phi angles.

5. The method of claim 4,
comprising the further step of
- j.) applying an inverse rotation matrix to the matrix of step d.) in order to obtain the phase center in the original coordinate system.

6. The method of claim 1,
wherein a near field to far field transformation is applied in case of an obtained near field signal, and a far field to far field transformation in case of an obtained far field signal.

7. The method of claim 6,
wherein the near field to far field transformation is a fast irregular field transformation FIAFTA.

8. The method of claim 1,
wherein polarization of the antenna under test is any of linear, slanted linear and/or circularly polarized.

9. The method of claim 8
wherein only one linear polarization is used in step e.) in case of circular polarization.

10. The method of claim 4,
wherein the transformation of step g.) is a Ludwig III transformation.

11. The method of claim 10,
wherein the measurement region has the shape of any spherical cap including a truncated spherical cap.

12. The method of claim 11,
wherein the measurement region has the shape of a hemisphere.

13. The method of claim 12,
wherein the antenna under test is a vehicle antenna, such as e.g. a car antenna or an airplane antenna, or a mobile terminal antenna, mounted on a rotatable support.

14. A computer-based measurement method for calculating the phase center of the antenna under test, programmed to perform the method according to claim 1, and for outputting a phase center indication signal.

15. A program of instructions storable on a computer readable medium for causing a computer to execute steps of the method according to claim 1.

* * * * *